(12) United States Patent
Sakurai et al.

(10) Patent No.: US 7,768,795 B2
(45) Date of Patent: Aug. 3, 2010

(54) ELECTRONIC CIRCUIT DEVICE, ELECTRONIC DEVICE USING THE SAME, AND METHOD FOR MANUFACTURING THE SAME

(75) Inventors: Daisuke Sakurai, Osaka (JP); Masahiro Ono, Kanagawa (JP); Kazuhiro Nishikawa, Osaka (JP)

(73) Assignee: Panasonic Corporation, Osaka (JP)

( * ) Notice: Subject to any disclaimer, the term of this patent is extended or adjusted under 35 U.S.C. 154(b) by 783 days.

(21) Appl. No.: 11/660,515

(22) PCT Filed: Aug. 31, 2005

(86) PCT No.: PCT/JP2005/015892

§ 371 (c)(1),
(2), (4) Date: Feb. 20, 2007

(87) PCT Pub. No.: WO2006/027981

PCT Pub. Date: Mar. 16, 2006

(65) Prior Publication Data

US 2008/0094793 A1 Apr. 24, 2008

(30) Foreign Application Priority Data

Sep. 8, 2004 (JP) ............................. 2004-261091

(51) Int. Cl.
*H01R 12/16* (2006.01)
(52) U.S. Cl. ...................... 361/790; 361/763; 361/766; 361/795; 361/803
(58) Field of Classification Search ......... 361/736–737, 361/760–766, 790, 803; 257/685–686
See application file for complete search history.

(56) References Cited

U.S. PATENT DOCUMENTS

| 5,656,856 | A | * | 8/1997 | Kweon ........................ 257/686 |
| 6,038,133 | A | | 3/2000 | Nakatani et al. |
| 6,664,616 | B2 | * | 12/2003 | Tsubosaki et al. ........... 257/668 |
| 6,714,418 | B2 | * | 3/2004 | Frankowsky et al. ........ 361/735 |
| 7,514,636 | B2 | * | 4/2009 | Sasaki ......................... 174/252 |
| 2001/0040793 | A1 | | 11/2001 | Inaba |
| 2003/0137045 | A1 | | 7/2003 | Sugaya et al. |
| 2004/0104469 | A1 | | 6/2004 | Yagi et al. |

FOREIGN PATENT DOCUMENTS

| JP | 11-220262 | 8/1999 |
| JP | 2000-269411 | 9/2000 |
| JP | 2001-077294 | 3/2001 |
| JP | 2001-175834 | 6/2001 |
| JP | 2001-217388 | 8/2001 |
| JP | 2002-207986 | 7/2002 |
| JP | 2003-218319 | 7/2003 |
| JP | 2003-289128 | 10/2003 |

* cited by examiner

*Primary Examiner*—Tuan T Dinh
(74) *Attorney, Agent, or Firm*—Wenderoth, Lind & Ponack, LLP.

(57) ABSTRACT

Electronic circuit device (100) is structured so that a substrate module unit that are formed by stacking substrate modules made of a first resin sheet with electronic component (190) embedded thereinto is inserted into housing (150) including connecting terminal (120), control circuit (130), and first wiring pattern (140), where the substrate modules are connected to each other electrically and mechanically. This electronic circuit device (100) dispenses with a mother substrate. Further, with slimming down of a substrate module, a substrate module unit with a large number of substrate modules stacked can be loaded in a limited packaging space, thus mounting greater storage capacity and higher functionality.

16 Claims, 15 Drawing Sheets

ELECTRONIC CIRCUIT DEVICE, ELECTRONIC DEVICE USING THE SAME, AND METHOD FOR MANUFACTURING THE SAME

This application is a U.S. national phase application of PCT International Application PCT/JP2005/015892, filed Aug. 31, 2005.

TECHNICAL FIELD

The present invention relates to a compact electronic circuit device incorporating substrate modules mounting electronic components thereon, in a housing, to an electronic device using the circuit device, and to a method for manufacturing the circuit device.

BACKGROUND ART

In recent years, with higher functionality of IC cards and greater storage capacity of memory cards, an electronic circuit device has been demanded that mounts semiconductor elements and other components with high density. Still, with higher functionality and reduction in the size and weight of mobile devices, an electronic circuit device requires higher functionality and compactification. For a memory card, for example, how to increase its storage capacity within its standardized size is important. For a circuit substrate, meanwhile, as well as an approach to increase packaging density by miniaturization of connection pitches and multilayering, technology has been positively developed to increase packaging density by stacking module substrates mounting semiconductor elements and electronic components therein, in a multilayered manner.

Japanese Patent Unexamined Publication No. 2002-207986 (described as "patent document" hereinafter) discloses a memory card with the following structure as shown in FIG. 16. That is, memory module substrates 420 mounting memory chip 410 on one side of mother substrate 400 are stacked in a two-layered manner; circuit control element 430 for controlling the above-described memory chip 410 is mounted on the other surface of mother substrate 400; and they are incorporated into housing 480.

In this memory card, memory module substrates 420 are connected to each other with Cu ball 440 or an elastic body covered with a conductive film, with a diameter of approximately 300 μm. In the same way, the bottom surface of memory module substrate 420 at the lower side is connected to mother substrate 400 with Cu ball 450 or an elastic body covered with a conductive film. Further, the top surface of mother substrate 400 is loaded thereon with chip capacitor 460 for bypassing, and the bottom surface is provided thereon with connecting terminal 470.

In a conventional electronic circuit device described in the patent document, the memory module substrates are connected to each other with a Cu ball or an elastic body covered with a conductive film, and so are the memory module substrate and the mother substrate. However, the Cu ball needs to secure a certain distance between the substrates to prevent memories from contacting each other, by means of its size, and thus the size cannot be reduced.

Wiring connection can be performed only in one direction: from the memory module substrate to the mother substrate. Further, a memory module substrate on which different ICs such as logic ICs and ASICs are combined has more electrodes as the number of stacked layers increases, thus requiring minute wiring connections. Consequently, miniaturization is difficult in wiring connection with Cu balls, but is possible if Cu balls are arranged in a staggered manner so as not to contact each other. In this case, however, the area for connection electrodes increases, and thus the packaging area for semiconductor elements and others undesirably decreases.

In the above-described connection process, a Cu ball or elastic body is difficult to be fixed at a given position, thus resulting in poor workability and yields.

In addition, requiring a mother substrate causes the space for mounting semiconductor elements to be limited, thus making miniaturization and slimming down difficult. For a device with a standardized size particularly, such as a memory card, the packaging space is strictly limited. That is to say, an attempt to increase the number of semiconductor elements to expand the memory capacity is unsuccessful due to the constant standardized size of the memory card. An IC card has a similar standard mainly for its thickness.

Eventually, how to mount in a housing of a standardised size remains to be solved in these electronic circuit devices.

These electronic circuit devices, which are mass-produced items, require favorable workability and a method for manufacturing with easy automatization, along with high reliability.

Meanwhile, when a memory card is deformed, the module substrate itself bends with a Cu ball as the supporting point, and thus the mounted semiconductor elements and the like are undesirably prone to break.

SUMMARY OF THE INVENTION

In order to solve the problems as described above, an electronic circuit device of the present invention has a control circuit; a housing including a connecting terminal and a first wiring pattern; and a substrate module unit formed by embedding an electronic component into a first resin sheet so as to expose the electrode terminal, by integrally stacking multiple substrate modules provided with a second wiring pattern connecting to the electrode terminal on the surface of the first resin sheet through a second resin sheet, and by connecting the second wiring patterns between different substrate modules to each other through a through conductor. The substrate module unit is inserted into the housing, and the first wiring pattern of the housing is connected to the through conductor.

With this makeup, a slim electronic circuit device is available that allows high-density packaging without limitation of the packaging density due to connecting material or the like, as a result that a substrate module unit that is formed by integrally stacking the required number of substrate modules with electronic components embedded thereinto is connected to the first wiring pattern formed on the inner surface of the housing. Still, the integrated substrate module unit enables to make an electronic circuit device with improved mechanical strength and high reliability.

Another electronic circuit device of the present invention has a control circuit; a housing including a connecting terminal and a first wiring pattern; and a substrate module unit formed by embedding a joint electronic component formed by integrally bonding together the first surfaces of two electronic components with electrode terminals formed near two opposite sides of the second surfaces, with the positions of both electrode terminals displaced, into a first resin sheet so as to expose the surfaces of the electrode terminals, by integrally stacking multiple substrate modules provided with a second wiring pattern connecting to the electrode terminal on the surface of the first resin sheet, and by connecting the second wiring patterns between different substrate modules to each other through a through conductor. The substrate module unit is inserted into the housing, and the first wiring pattern of the housing is connected to the through conductor.

This makeup dispenses with a second resin sheet between the stacked substrate modules, thus further promoting slimming down. This enables high-density packaging of electronic components in a housing with a limited packaging space.

A method for manufacturing an electronic circuit device of the present invention has a step of forming a connecting terminal, control circuit, and first wiring pattern, in a housing; a step of forming a substrate module unit that is formed by integrally stacking multiple substrate modules through a second resin sheet, where each of the substrate modules has an electronic component with electrode terminals formed on one surface of the component, a first resin sheet with the electronic component embedded thereinto so that the surfaces of the electrode terminals are exposed, a second wiring pattern connected to the electrode terminals exposed at the surface of the first resin sheet, and a through conductor connecting between the second wiring patterns; and a step of connecting the through conductor of the substrate module unit to the first wiring pattern of the housing.

Another method for manufacturing an electronic circuit device of the present invention has a step of forming a connecting terminal, control circuit, and first wiring pattern, in a housing; a step of forming a substrate module unit that is formed by integrally stacking multiple substrate modules having a joint electronic component formed by integrally bonding together the first surfaces of two electronic components with electrode terminals formed near two opposite sides of the second surfaces, with the positions of both electrode terminals displaced, a first resin sheet with the joint electronic component embedded thereinto so that the electrode terminals are exposed, and a second wiring pattern connecting to the electrode terminals exposed at the surface of first resin sheet, and by connecting the second wiring patterns between different substrate modules to each other with a through conductor; and a step of connecting the through conductor of the substrate module unit to the first wiring pattern of the housing.

These methods allow an electronic circuit device with greater storage capacity and higher functionality in a limited packaging space to be produced with high productivity, owing to integrally stacking slim substrate modules mounting electronic components with high density.

REFERENCE MARKS IN THE DRAWINGS

Figure 1A:
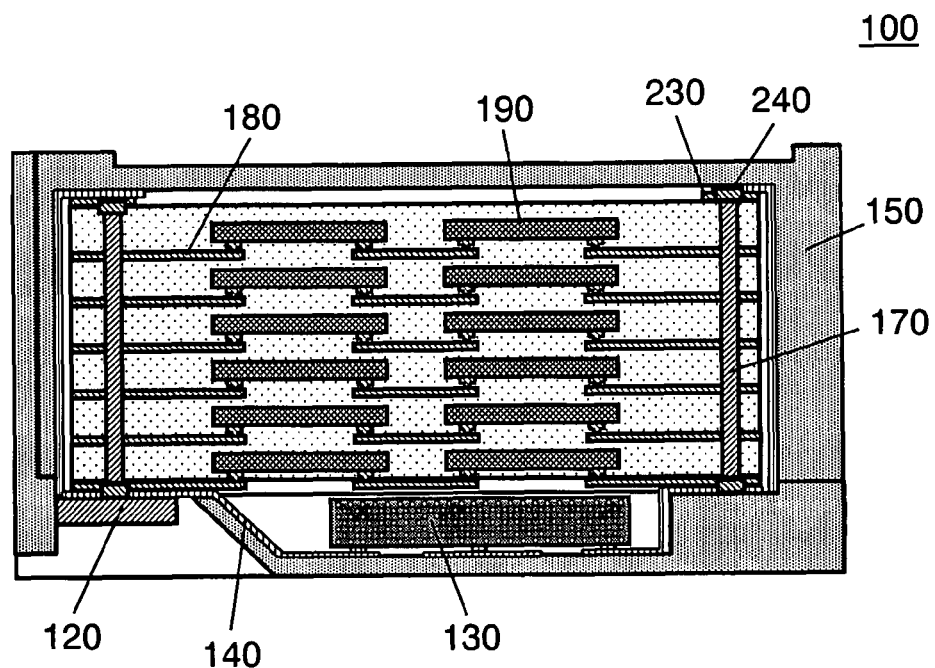
FIG. 1A is a sectional view of an electronic circuit device according to the first exemplary embodiment of the present invention.

100 Electronic circuit device
110, 250, 310 Substrate module unit
120 Connecting terminal
130 Control circuit
140 First wiring pattern
150 Housing
160, 260, 320 Substrate module
170 Through conductor
180 Second wiring pattern
190, 340, 350 Electronic component
200 Electrode terminal
210 First resin sheet
210A Surface (of first resin sheet)
210B Back surface (of first resin sheet)
220, 360, 370 Composite resin sheet
230 First land
240 Second land
270, 330 Joint electronic component
280 Second resin sheet
290 End
300 Land

DETAILED DESCRIPTION OF PREFERRED EMBODIMENTS

Hereinafter, a description is made for embodiments of the present invention with reference to their related drawings, which are enlarged to illustrate the inside minutely.

First Exemplary Embodiment

Figure 1B:
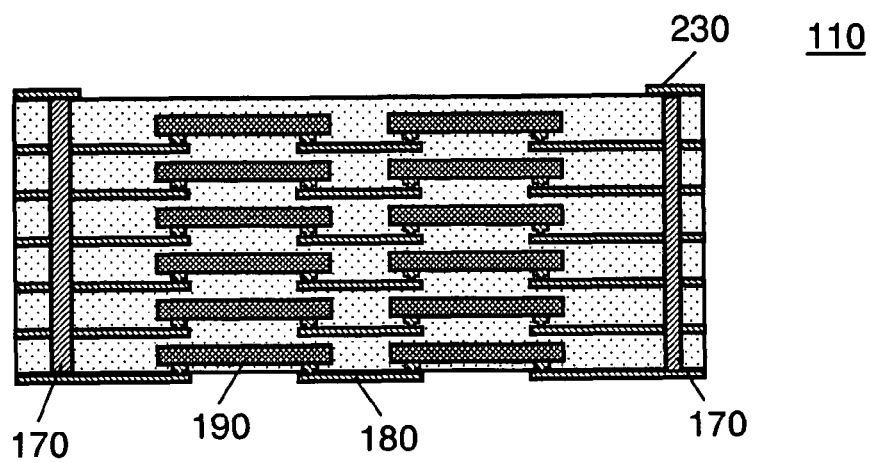
FIG. 1B is a sectional view of the substrate module unit of the electronic circuit device according to the first embodiment of the present invention.
Figure 1C:
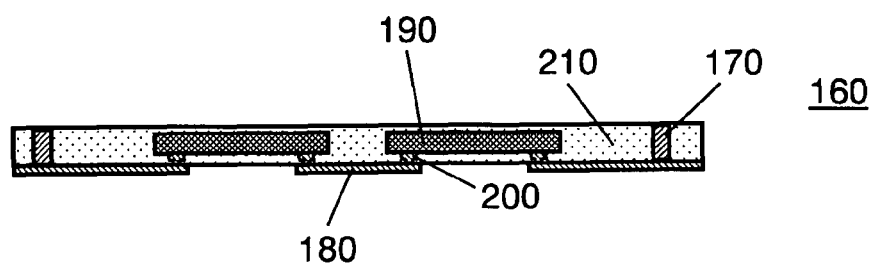
FIG. 1C is a sectional view of the substrate module of the electronic circuit device according to the first embodiment of the present invention.

FIG. 1A is a sectional view of an electronic circuit device according to the first exemplary embodiment of the present invention; FIG. 1B is a sectional view of the substrate module unit; and FIG. 1C is a sectional view of a substrate module.

As shown in FIG. 1A, electronic circuit device 100 according to the first embodiment of the present invention has substrate module unit 110 inserted into housing 150 provided with control circuit 130 including connecting terminal 120 and semiconductor element, and with first wiring pattern 140. Then, first wiring pattern 140 formed on the inner surface of housing 150 is connected to second wiring pattern 180 of substrate module unit 110 electrically and mechanically through conductor 170 with conductive paste, solder, anisotropic conductive resin, or the like, to form electronic circuit device 100.

Here, control circuit 130, an LSI composed of semiconductor elements, is mounted on an electrode pad (not illustrated) of first wiring pattern 140 formed on the inner surface of housing 150, by flip chip method, for example.

This makeup dispenses with a mother substrate for mounting substrate module unit 110, thus allowing substrate module 160 a large packaging space in housing 150. As a result, for a memory card, IC card, and the like, with defined thickness, substrate module unit 110 formed by multilayering substrate modules 160 facilitates an increase in storage capacity. Here, housing 150 has connecting terminal 120 for connecting to an outside circuit and an electronic device, provided integrally with housing 150.

Here, housing 150 is formed with resin such as polyetherimide (PEI), polyether sulfone (PES), polysulfone (PSF), syndiotactic polystyrene (SPS), polyamide resin (PA), polyphenylene oxide (PPO), polyphenylene ether (PPE), polyphthalamide (PPA), or liquid crystal polymer (LCP).

First wiring pattern 140 and electrodes of connecting terminal 120 are formed with Cu plating, Cu foil, conductive paste, for example.

As shown in FIG. 1B, substrate module unit 110 is formed by stacking six pieces of substrate modules 160 shown in FIG. 1C, for example, and by fusion bonding each other under heat and pressure to be integrated. Substrate module unit 110 is structured so that second wiring patterns 180 formed on different substrate modules 160 are connected to each other electrically and mechanically with through conductor 170. At this moment, the connection boundary surface of first resin sheet 210 of each substrate module 160 disappears, and each electronic component 190 is embedded into the integrated first resin sheet.

This makeup increases the mechanical strength of substrate module unit 110 and improves reliability against deformation due to bending stress on housing 150.

As shown in FIG. 1C, substrate module 160 is structured so that electronic component 190 is embedded into first resin sheet 210 so as to expose electrode terminal 200, and the surface of first resin sheet 210 is provided with second wiring pattern 180 and through conductor 170. Then, through conductor 170 is formed by filling conductive resin into a through hole opened at a given position of first resin sheet 210 by laser beam machining, drilling, or the like.

Here, in order to increase the packaging density, electronic component 190 preferably uses a bare chip that is chip-like and is flaked by grinding the back surface. As electronic component 190, a semiconductor memory is used such as a DRAM, SRAM, flash memory, and FRAM. What is used as first resin sheet 210 is thermoplastic resin such as polyester resin, vinyl chloride, polycarbonate, polyether ether ketone, polyether ketone, polyaryl ketone, polyetherimide, polyphenylene sulfide, syndiotactic polystyrene, thermoplastic polyimide, or acrylonitrile butadiene styrene; or epoxide-based or acrylic thermosetting resin are used.

Figure 2:
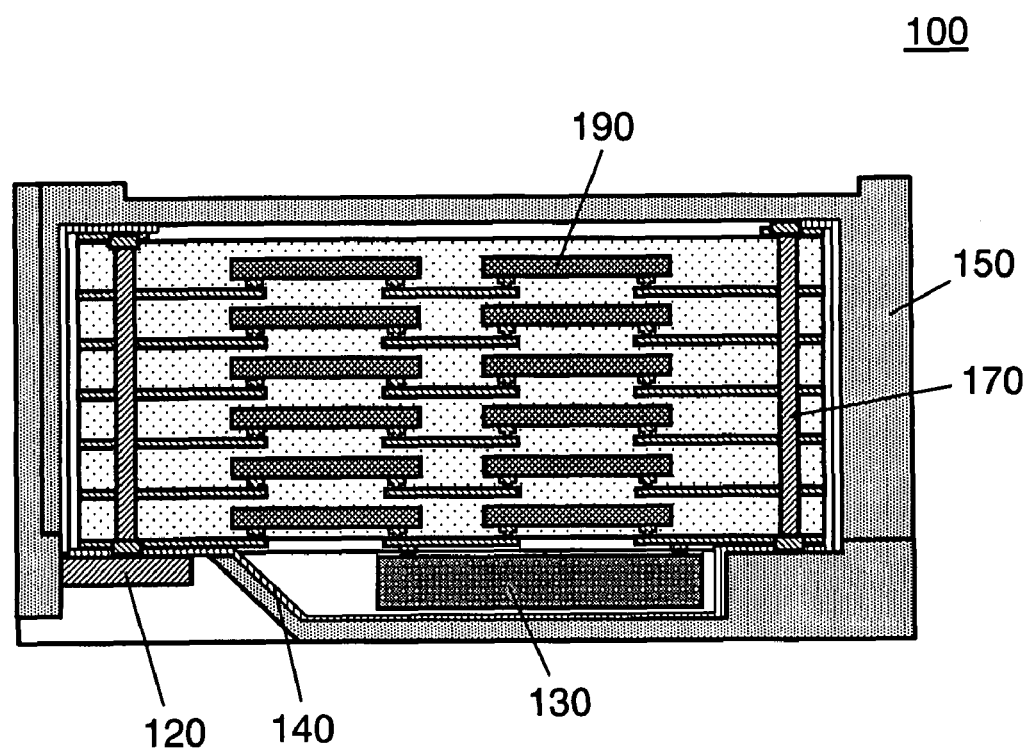
FIG. 2 is a sectional view of another example of the electronic circuit device according to the first embodiment of the present invention.

Hereinafter, a description is made for another example of the electronic circuit device according to the first embodiment of the present invention using FIG. 2.

Another example of the electronic circuit device according to the first embodiment of the present invention loads control circuit 130 on substrate module unit 110.

Generally, first wiring pattern 140 on the inner surface of housing 150 needs to be formed in a multilayered manner, and thus it is difficult to form first wiring pattern 140 having a minute electrode pad required for connecting control circuit 130 compared to a case of forming on a plane. However, in the electronic circuit device shown in FIG. 2, what is formed on the inner surface of housing 150 is first wiring pattern 140 only, while a minute electrode pad or the like for mounting and connecting to control circuit 130 does not need to be formed. Consequently, forming a minute electrode pad for connecting to control circuit 130 on substrate module unit 110, flat and easy to miniaturize, makes it easy to mount control circuit 130 requiring a fine-pitch electrode pad.

Hereinafter, a description is made for a method for manufacturing substrate module unit 110 according to the first embodiment, referring to FIG. 3 and FIGS. 4A through 4C.

Figure 3:
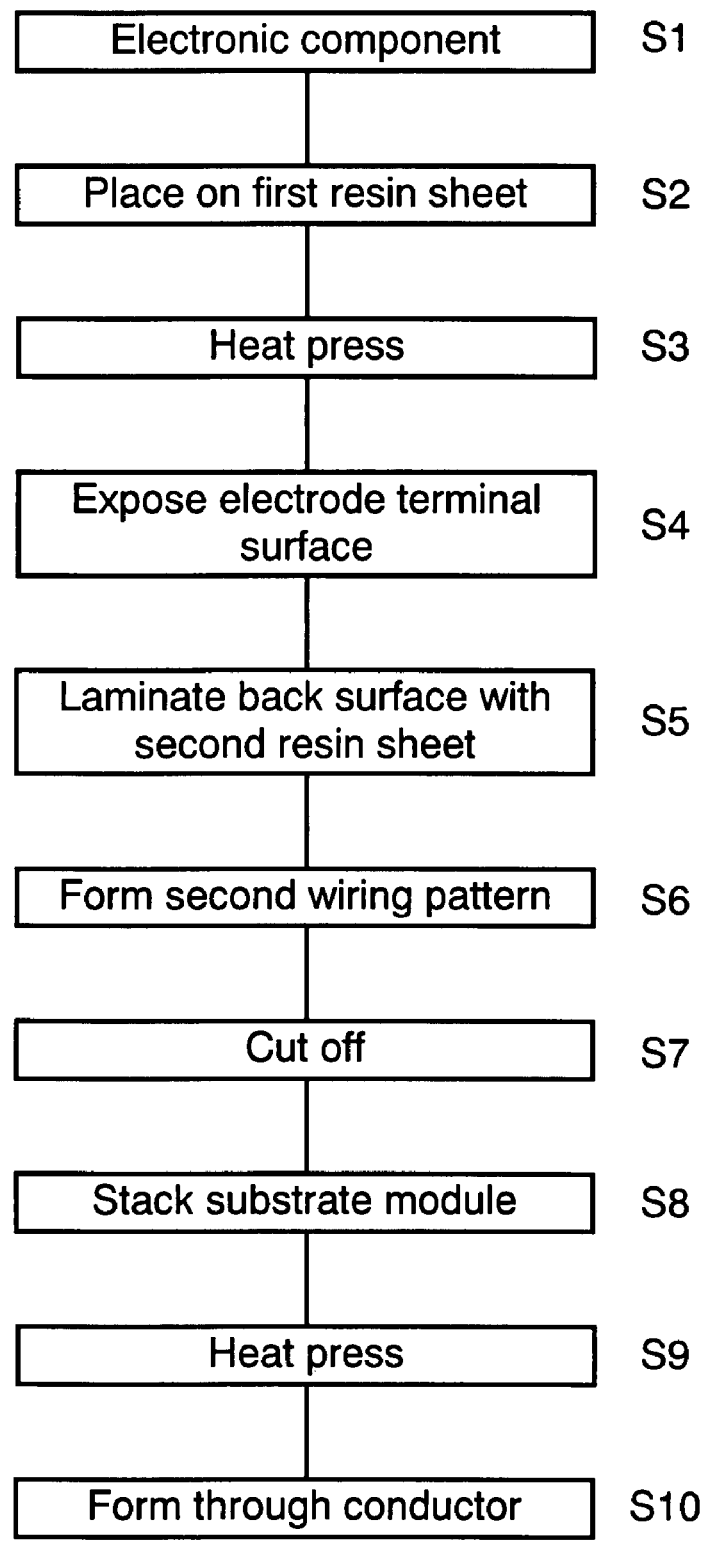
FIG. 3 is a flowchart illustrating a method for manufacturing the substrate module unit according to the first embodiment of the present invention.
Figure 4A:
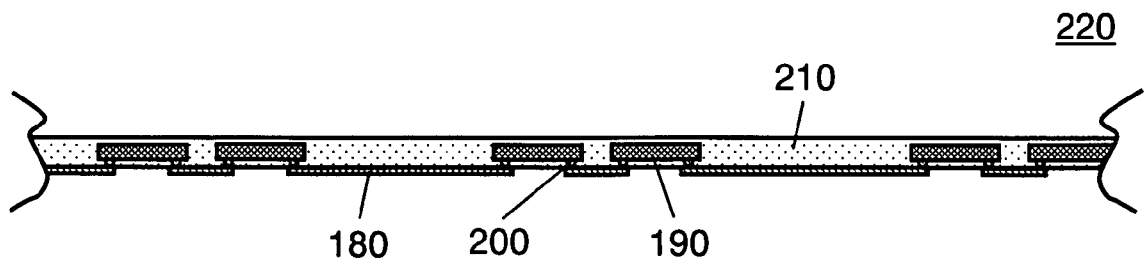
FIG. 4A is a sectional view of the substantial part illustrating the method for manufacturing the substrate module unit according to the first embodiment of the present invention.
Figure 4B:
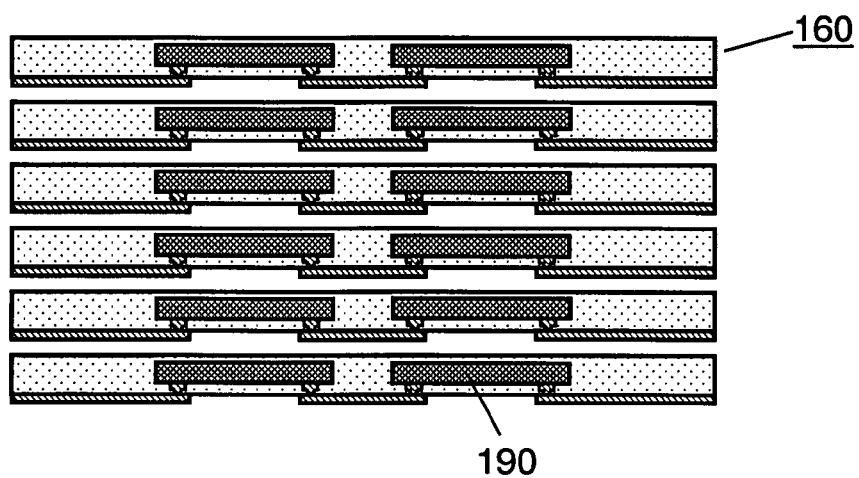
FIG. 4B is a sectional view of the substantial part illustrating the method for manufacturing the substrate module unit according to the first embodiment of the present invention.
Figure 4C:
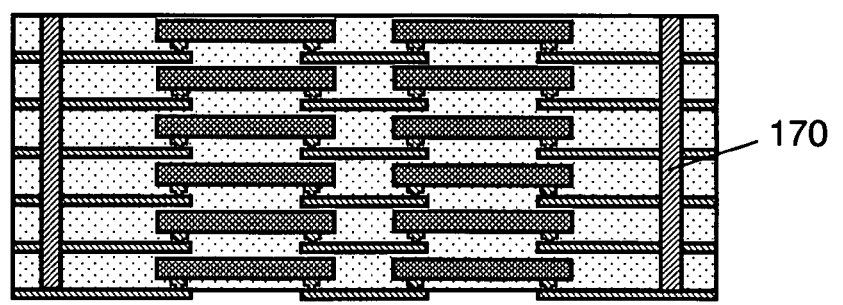
FIG. 4C is sectional view of the substantial part illustrating the method for manufacturing the substrate module unit according to the first embodiment of the present invention.

FIG. 3 is a flowchart illustrating a method for manufacturing substrate module unit 110 according to the first embodiment of the present invention; FIGS. 4A through 4C are sectional views of the substantial part for the major processing steps in FIG. 3.

First, in step S1, prepare electronic component 190 that has electrode terminal 200 formed on its one surface, and is flaked by grinding the other surface. Hereinafter, the thickness of electronic component 190 is assumed to be approximately 50 µm for description.

Next, in step S2, place one or more electronic components 190 having electrode terminal 200 at a given position on first resin sheet 210 with a thickness of approximately 75 µm, made of thermoplastic resin or the like.

Next, in step S3, first sandwich resin sheet 210 with electronic component 190 placed thereon between heat pressing plates, for example, and then heat and press it. In a case of polyester resin with a softening temperature of 120° C. and a melting temperature of 160° C., for example, welding force is 30 kg/cm$^2$, heating temperature is 160° C., and pressing time is 1 minute. These conditions cause electronic component 190 to be embedded into first resin sheet 210 while exposing electrode terminal 200.

Here, first resin sheet 210 can be polyester resin, polyethylene terephthalate (PETG), vinyl chloride, polycarbonate, acrylonitrile butadiene styrene, or the like.

Next, in step S4, remove the residue of first resin sheet 210 on the surface with electrode terminal 200 of electronic component 190 by photolithography and etching, or laser beam machining, to reliably expose electrode terminal 200 at the surface. Alternatively, press a jig heated to a temperature higher than the melting temperature of first resin sheet 210 against electrode terminal 200 to expose it. Here, this step S4 may be omitted if electrode terminal 200 is exposed when the electronic component is embedded into first resin sheet 210 in step S3.

Next, in step S5, the surface (back surface) of electronic component 190, opposite to the surface with electrode terminal 200, is laminated with a second resin sheet (not illustrated) with a thickness of approximately 25 µm, for example.

Next, in step S6, form second wiring pattern 180 connecting between electrode terminals 200 by screen printing with conductive paste, ink jet printing, dispense print, transfer printing, metal foil transfer, plating, thin film formation, or photolithography, for example.

Here, in step S5, lamination may be performed with a second resin sheet after step S6 in which second wiring pattern 180 is formed on the surface with electrode terminal 200 of electronic component 190.

The above-described method completes composite resin sheet 220 with electronic component 190 embedded thereinto and second wiring pattern 180 formed thereon as shown in FIG. 4A.

Next, in step S7, composite resin sheet 220 produced by the above-described method is cut off in the unit of substrate module 160.

Next, in step S8, stack six pieces of substrate modules 160, for example, as shown in FIG. 4B.

Next, in step S9, sandwich these stacked substrate modules 160 between heat pressing plates and then heat and press the modules, for example, to melt and integrate six pieces of first resin sheets 210 and the second resin sheet. Here, in a case where first resin sheet 210 and second resin sheet are polyethylene terephthalate, for example, the welding force is 35 kg/cm$^2$, the heating temperature is 150° C., and the pressing time is 1 minutes.

Next, in step S10, form a through hole at a given position of the integrated substrate module, and fill conductive paste into the hole and harden the paste, to complete substrate module unit 110 having through conductor 170 as shown in FIG. 4C.

Next, mount control circuit 130 in housing 150 with first wiring pattern 140 and connecting terminal 120 formed thereon. Here, the first wiring pattern is formed by plating, ink jet of conductive paste, dispenser, or transfer, for example.

Then, insert substrate module unit 110 shown in FIG. 4C into housing 150, and connect first land 230 of substrate module unit 110 to second land 240 on the inner surface of housing 150 with conductive paste or the like.

Alternatively, the following method may be used. That is, insert substrate module unit 110 into housing 150, and after connecting, fill insulation resin or the like to embed substrate module unit 110.

The above-described method completes electronic circuit device 100 as shown in FIG. 1A.

Here, the following method may be used as well. That is, a through hole is formed for each substrate modules 160 on composite resin sheet 220, and after cutting off, the through holes are aligned when stacking substrate modules 160 to form through conductor 170, and then second wiring patterns 180 between different substrate modules 160 are connected to each other. This method applies to the following exemplary embodiments as well.

Second Exemplary Embodiment

Figure 5A:
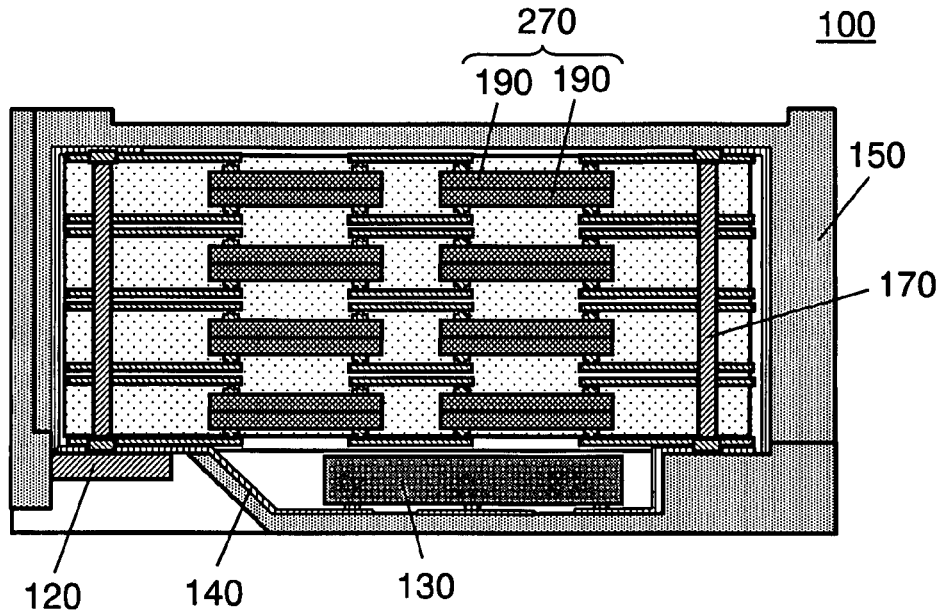
FIG. 5A is a sectional view of an electronic circuit device according to the second exemplary embodiment of the present invention.
Figure 5B:
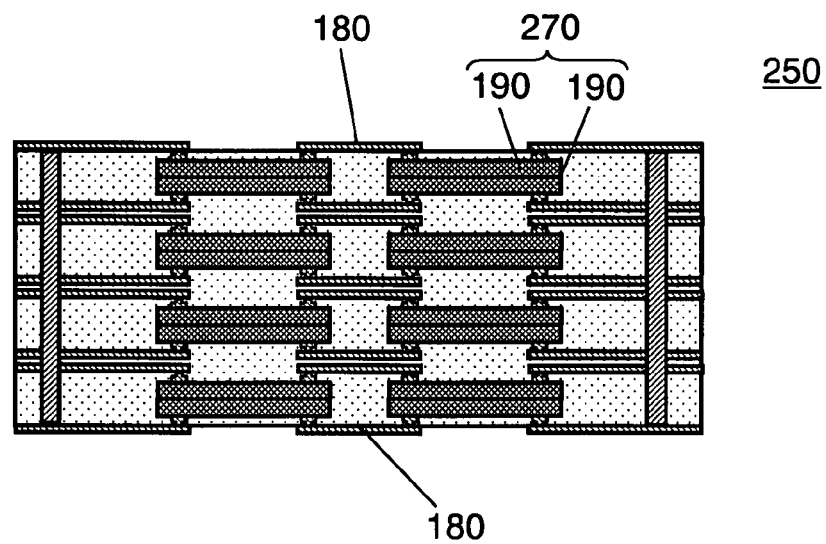
FIG. 5B is a sectional view of the substrate module unit of the electronic circuit device according to the second embodiment of the present invention.
Figure 5C:
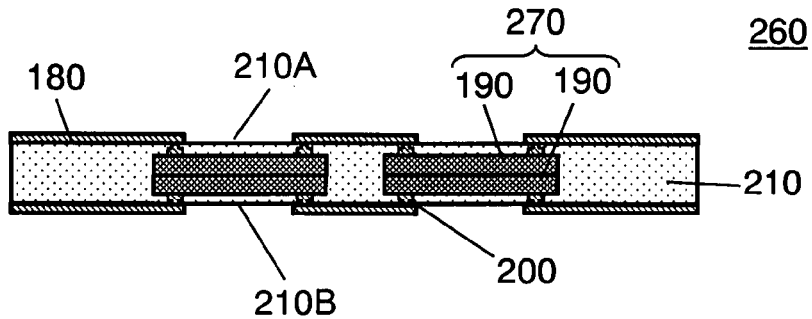
FIG. 5C is a sectional view of the substrate module of the electronic circuit device according to the second embodiment of the present invention.

FIG. 5A is a sectional view of an electronic circuit device according to the second exemplary embodiment of the present invention; FIG. 5B is a sectional view of a substrate module unit; FIG. 5C is a sectional view of a substrate module. In FIGS. 5A through 5C, a component with the same makeup as that in FIG. 1 is given the same reference mark to omit its description.

In electronic circuit device 100 according to the second embodiment of the present invention, as shown in FIG. 5A, substrate module unit 250 is inserted into housing 150 including connecting terminal 120, control circuit 130, and first wiring pattern 140. Then, first wiring pattern 140 formed on the inner surface of housing 150 is connected to second wiring pattern 180 of substrate module unit 250 electrically and mechanically through conductor 170 with conductive paste or the like.

Substrate module unit 250, as shown in FIG. 5B, is structured with substrate modules 260 shown in FIG. 5C stacked in four layers, for example, and heated and pressed to be integrated. Then, second wiring patterns 180 formed on each substrate module 260 are connected to each other with through conductor 170 provided in a region where joint electronic component 270 does not exist. Here, joint electronic component 270 is formed by integrally bonding together the first surfaces of two electronic components 190 with electrode terminals 200 formed on second surfaces thereof.

As shown in FIG. 5C, substrate module 260 is structured so that joint electronic component 270 is embedded into first resin sheet 210, and second wiring pattern 180 is provided on the surface 210A and back surface 210B, where the structure is different from substrate module 160 according to the first embodiment.

This makeup, in which two electronic components 190 are integrally embedded into first resin sheet 210, enables further slimming down of substrate module 260 as compared to substrate module 160 according to the first embodiment, which mounts the same number of electronic components 190. Still, the packaging density of electronic component 190 is increased in a standardised packaging space. Further, layering flaked electronic components 190 and bonding them together increase strength against deformation and the like, thus improving the reliability.

Hereinafter, a description is made for another example of the electronic circuit device according to the second embodiment of the present invention using FIG. 6.

Electronic circuit device 100 according to another example of the second embodiment of the present invention is loaded with control circuit 130 on substrate module unit 250.

Generally, in a case of forming first wiring pattern 140 in a multilayered manner on the inner surface of housing 150, forming a minute electrode pad and the like is more difficult compared to forming on a flat surface.

Figure 6:
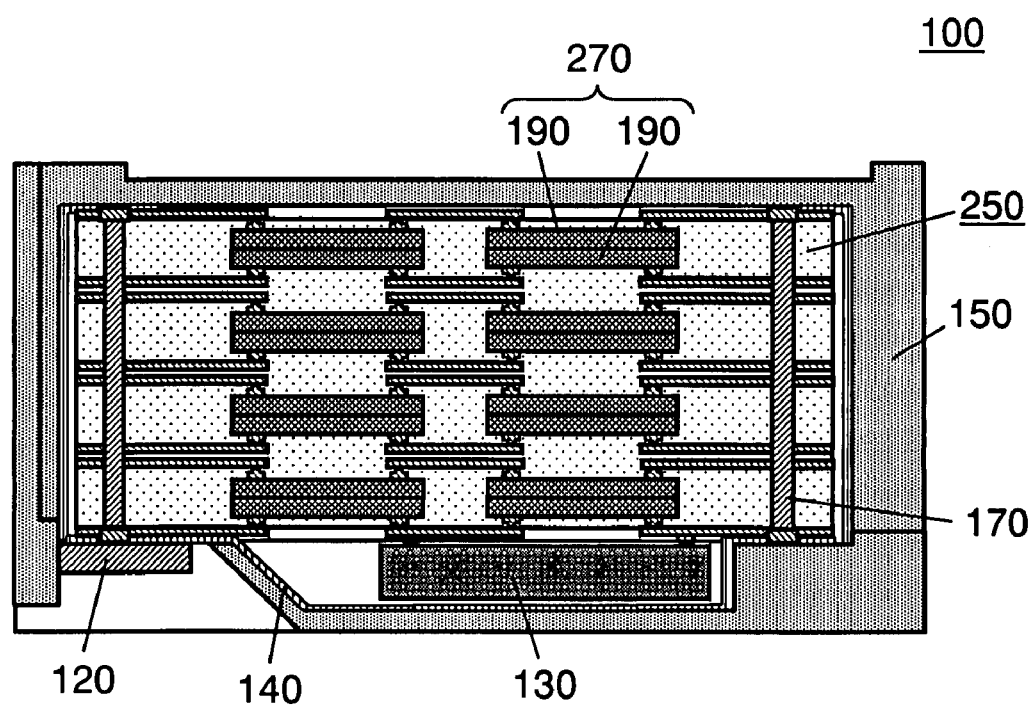
FIG. 6 is a sectional view of another example of the electronic circuit device according to the second embodiment of the present invention.

However, in the electronic circuit device shown in FIG. 6, what is formed on the inner surface of housing 150 is first wiring pattern 140 with large pitches only, and forming a fine-pitch electrode pad for mounting control circuit 130 is not needed. Consequently, forming a minute electrode pad for connecting to control circuit 130 on substrate module unit 250, flat and easy to miniaturize, allows easily mounting control circuit 130 requiring a fine-pitch electrode pad.

Hereinafter, a description is made for a method for manufacturing substrate module unit 250 according to the second embodiment of the present invention, referring to FIG. 7 and FIGS. 8A through 8D.

Figure 7:
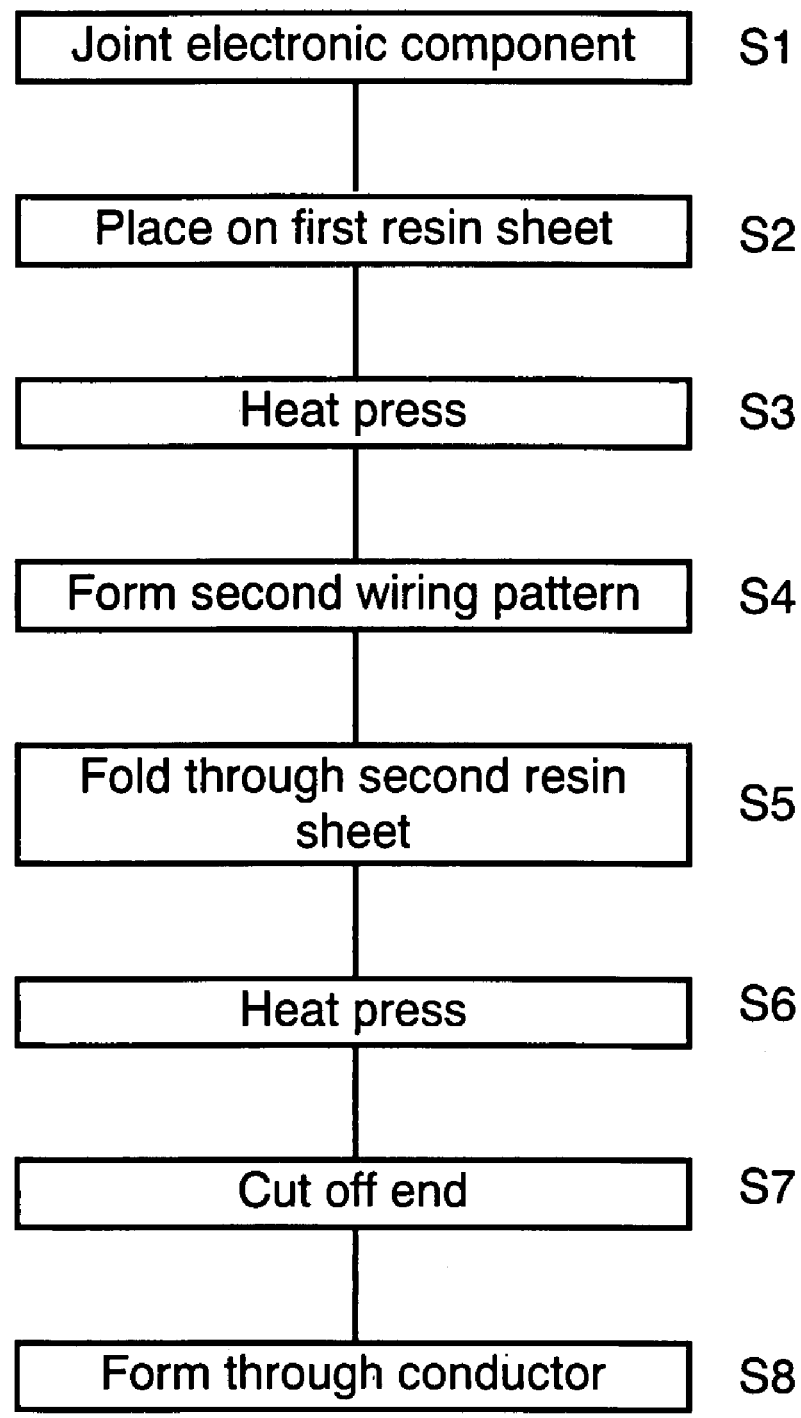
FIG. 7 is a flowchart illustrating a method for manufacturing the substrate module unit according to the second embodiment of the present invention.

FIG. 7 is a flowchart illustrating a method for manufacturing substrate module unit 250 according to the second embodiment of the present invention. FIGS. 8A through 8D are sectional views of the substantial parts in the major processing steps in FIG. 7.

First, in step S1, bond together the first surfaces of two electronic components 190 with electrode terminal 200 formed on each second surface with resin adhesive, for example, to produce joint electronic component 270. Assuming the thickness of each electronic component 190 is approximately 50 µm, for example, the thickness of joint electronic component 270 is approximately 100 µm.

Next, in step S2, one or more joint electronic components 270 are placed at a given position on first resin sheet 210 made of thermoplastic resin with a thickness of approximately 125 µm.

Next, in step S3, sandwich them between heat pressing plates, for example, and heat and press them.

This process causes joint electronic component 270 to be embedded into first resin sheet 210 while at least the surface with electrode terminal 200 is exposed. At this moment, the residue of first resin sheet 210 on electrode terminal 200 of joint electronic component 270 may be removed by photolithography, laser beam machining, or the like, to cause electrode terminal 200 to be exposed at surface 210A and back surface 210B of first resin sheet 210.

Figure 8A:
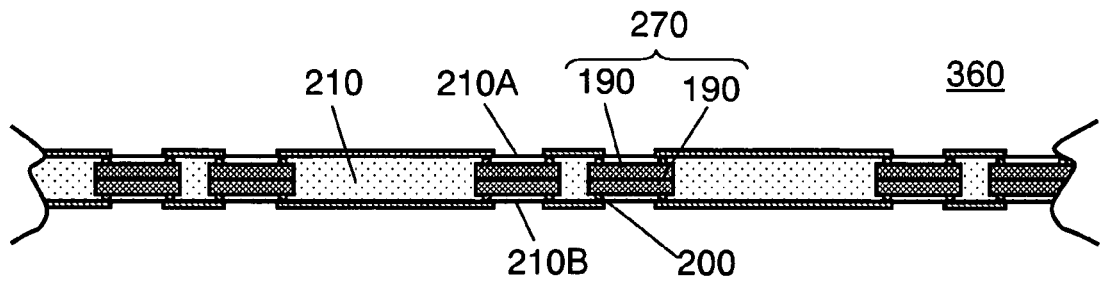
FIG. 8A is a sectional view of the substantial part illustrating the method for manufacturing the substrate module unit according to the second embodiment of the present invention.

Next, in step S4, form second wiring pattern 180 connecting between electrode terminals 200 on surface 210A and back surface 210B on first resin sheet 210 by screen printing, photolithography, or the like. Consequently, joint electronic component 270 as shown in FIG. 8A is embedded to complete composite resin sheet 360 including a large number of substrate modules 260 with second wiring pattern 180 formed thereon.

Figure 8B:
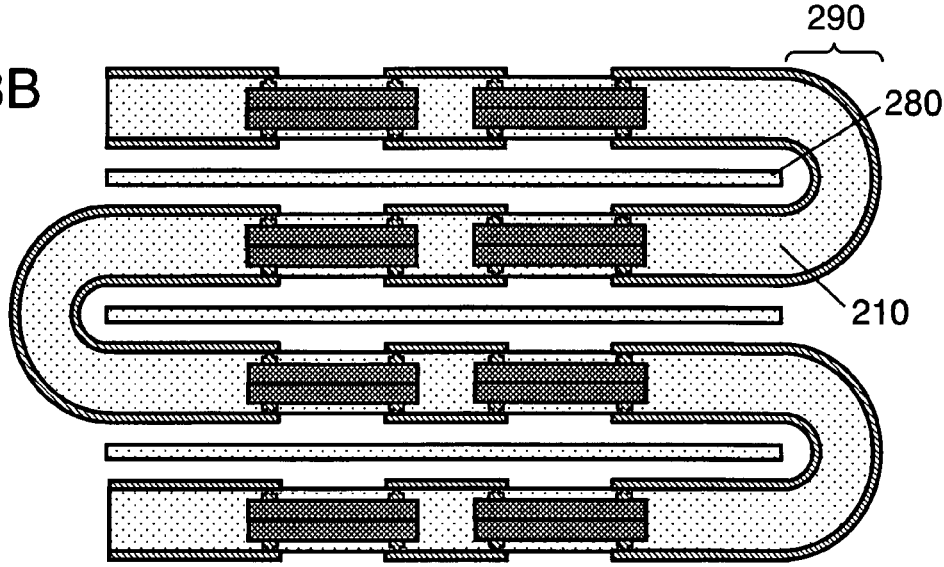
FIG. 8B is a sectional view of the substantial part illustrating the method for manufacturing the substrate module unit according to the second embodiment of the present invention.

Next, in step S5, as shown in FIG. 8B, fold composite resin sheet 360 produced by the above-described method for each substrate module 260, and arrange second resin sheet 280 between the substrate modules and then stack them. Here, second resin sheet 280 ensures insulation between substrate modules 260. FIG. 8B illustrates a state of the layers separated to show the stacked state clearly.

Next, in step S6, sandwich this folded composite resin sheet 360 between heat pressing plates, for example, and then heat and press it to melt and integrate first resin sheet 210 and second resin sheet 280. Here, if the material of the first and second resin sheets is polyethylene terephthalate, for example, the welding force is 35 kg/cm$^2$, the heating temperature is 120° C., and the pressing time is 1 minute. Here, although the materials of the first and second resin sheets do not need to be the same, their melting temperatures are preferably nearly equal to each other. If the material of the first resin sheet is different from that of the second one, the melting temperature of the first resin sheet is preferably lower than that of the second one, in order to prevent displacement of electronic components and the like. This situation applies to the other embodiments as well.

Figure 8C:
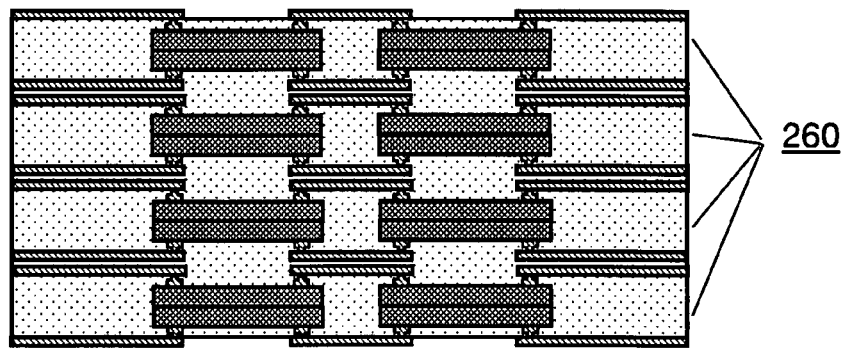
FIG. 8C is a sectional view of the substantial part illustrating the method for manufacturing the substrate module unit according to the second embodiment of the present invention.

Next, in step S7, cut off end 290 of folded composite resin sheet 360 to complete multiple stacked substrate modules 260 as shown in FIG. 8C.

Figure 8D:
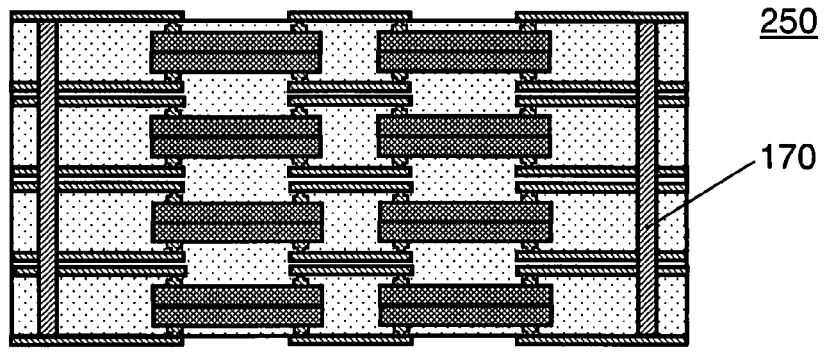
FIG. 8D is a sectional view of the substantial part illustrating the method for manufacturing the substrate module unit according to the second embodiment of the present invention.

Next, in step S8, form a through hole in a region where joint electronic component 270 of integrated substrate module 260 does not exist, and then fill conductive paste or the like into the hole with. When the paste is hardened, substrate module unit 250 having through conductor 170 as shown in FIG. 8D is completed.

If the packaging space has enough planar room, steps S7 and S8 may be omitted, and composite resin sheet 360 may be housed in the packaging space in a state folded and stacked as shown in FIG. 8B. In this case, composite resin sheet 360 needs to be bent so as not to break the second wiring pattern at a folded portion.

In the second embodiment of the present invention, the arrangement sequence of electrode terminals 200 of joint electronic component 270 is usually different between electronic component 190 on surface 210A and that on back surface 210B, of first resin sheet 210.

Figure 9:
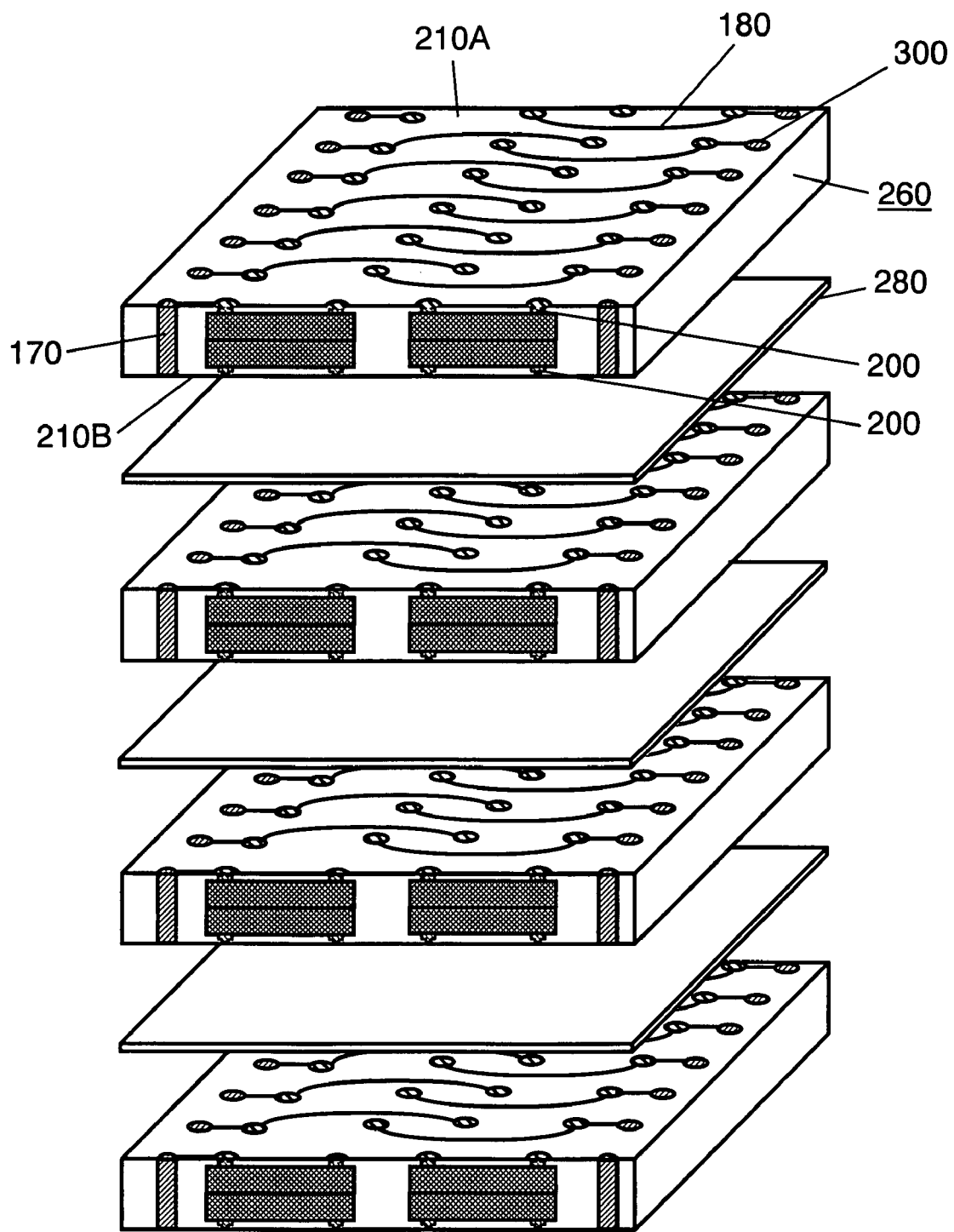
FIG. 9 is an exploded perspective view illustrating a second wiring pattern formed on the surface of the substrate module according to the second embodiment of the present invention, and a method of stacking these substrate modules.

Under the circumstances, a description is made for an example of second wiring pattern 180 connecting to electrode terminal 200 of joint electronic component 270 on substrate module unit 250, using FIG. 9.

FIG. 9 illustrates second wiring pattern 180 formed on surface 210A of first resin sheet in substrate module 260, and these substrate modules 260 in a state stacked through second resin sheet 280. Although a second wiring pattern formed on back surface 210B of first resin sheet in substrate module 260 is not illustrated in the drawing, electrode terminals 200 at the same position of electronic components 190 connected to each other are connected to lands 300 at the right and left, in the same way as second wiring pattern 180 on surface 210A. First land 300 on surface 210A of first resin sheet in substrate module 260, and second land 300 on back surface 210B, directly below the first one, correspond to electrode terminals 200 at the same position, both lands connected to each other through conductor 170. Then, these substrate modules 260 are stacked to form a substrate module unit. Here, a through conductor is not illustrated on the second resin sheet for convenience.

In the above-described second embodiment, the description is made for an example where electronic components are bonded individually. However, the present invention is not limited to this example. For example, if a joint electronic component is formed with electronic components having an identical shape in particular, the joint electronic component is produced with high productivity by the following method.

That is, first align the surfaces of two pieces of wafers, such as silicon substrates, with multiple semiconductor memories having electrode terminals, for example, on the second surfaces, and then bond them together.

Next, cut off the bonded wafers with a dicing cutter or the like for each semiconductor memory to separate them into individual joint electronic components.

With this method, a joint electronic component having its semiconductor memories bonded with a small amount of displacement can be formed efficiently.

In the above-described second embodiment, the description is made for an example where a composite resin sheet is folded to form a substrate module unit. However, the present invention is not limited to this example. For example, the composite resin sheet may be cut off individually for each substrate module, and the fragments are stacked to form a substrate module unit. This method dispenses with a portion to be an end, thus increasing the yield of substrate modules in a composite resin sheet.

Third Exemplary Embodiment

Figure 10A:
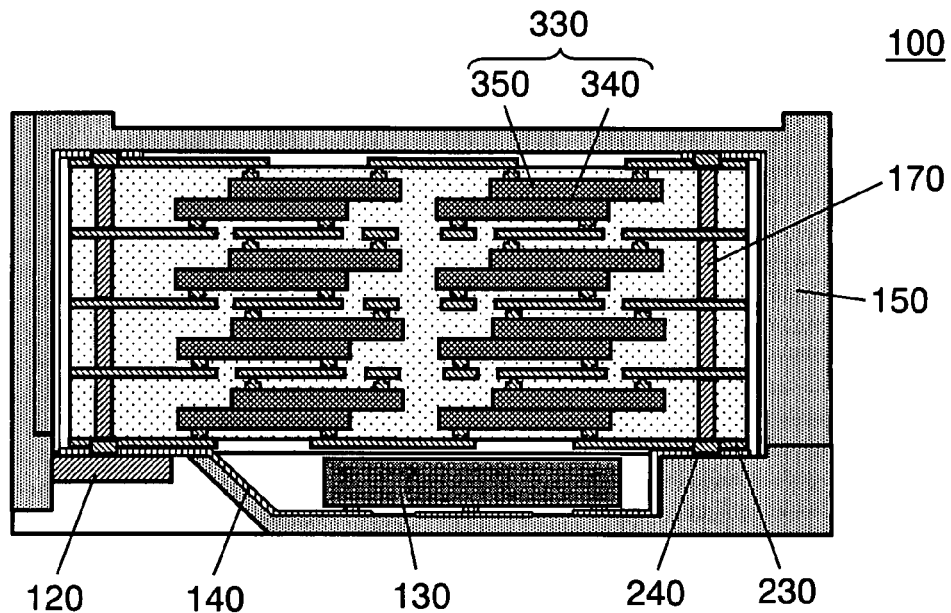
FIG. 10A is a sectional view of an electronic circuit device according to the third exemplary embodiment of the present invention.
Figure 10B:
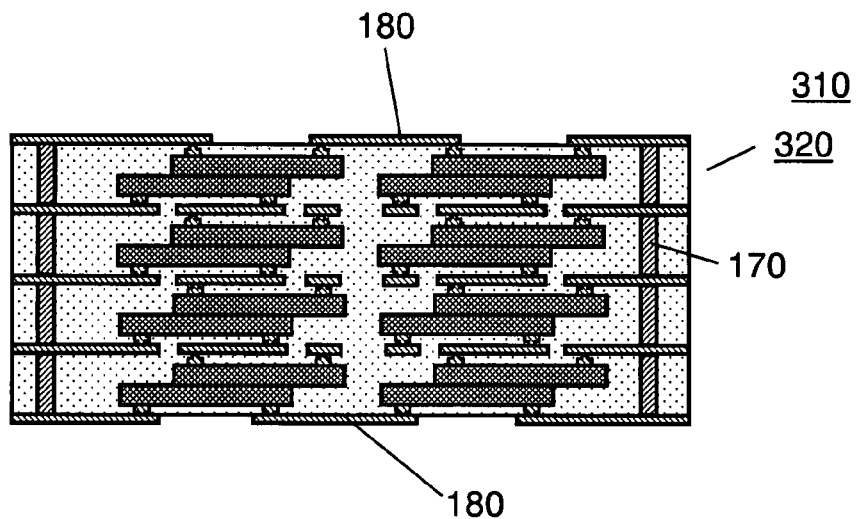
FIG. 10B is a sectional view of the substrate module unit of the electronic circuit device according to the third embodiment of the present invention.
Figure 10C:
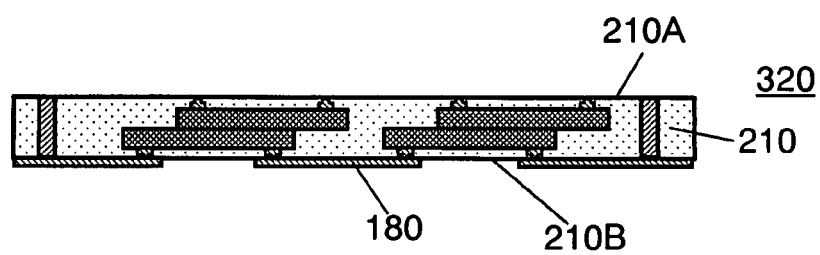
FIG. 10C is a sectional view of the substrate module of the electronic circuit device according to the third embodiment of the present invention.

FIG. 10A is a sectional view of an electronic circuit device according to the third embodiment of the present invention; FIG. 10B is a sectional view of the substrate module unit; FIG. 10C is a sectional view of a substrate module. In FIGS. 10A through 10C, a component with the same makeup as that in FIG. 5 is given the same reference mark to omit its description.

In electronic circuit device 100 according to the third embodiment of the present invention, as shown in FIGS. 10A through 10C, substrate module unit 310 is inserted into housing 150 including connecting terminal 120, control circuit 130, and first wiring pattern 140. Then, first wiring pattern 140 formed on the inner surface of housing 150 is connected to second wiring pattern 180 of substrate module unit 310 electrically and mechanically through conductor 170 with conductive paste or the like.

Substrate module unit 310, as shown in FIG. 10B, is structured with substrate modules 320 shown in FIG. 10C stacked in four layers, for example, and heated and pressed to be integrated. Then, second wiring patterns 180 formed on each substrate module 320 are connected to each other with through conductor 170 provided in a region where joint electronic component 330 does not exist.

As shown in FIG. 10C, substrate module 320 is structured so that joint electronic component 330 is embedded into first resin sheet 210, and second wiring pattern 180 is provided on at least one of the surface 210A and back surface 210B.

Here, joint electronic component 330 is formed by integrally bonding together the first surfaces of two electronic components 340, 350 with electrode terminals formed near two sides facing each other on the second surfaces, so that electronic components 340, 350 do not overlap thickness-wise, which is different from substrate module 260 in the second embodiment.

With this makeup, a slim substrate module unit can be produced dispensing with a second resin sheet according to the second embodiment.

Hereinafter, the reason is described.

Figure 11A:
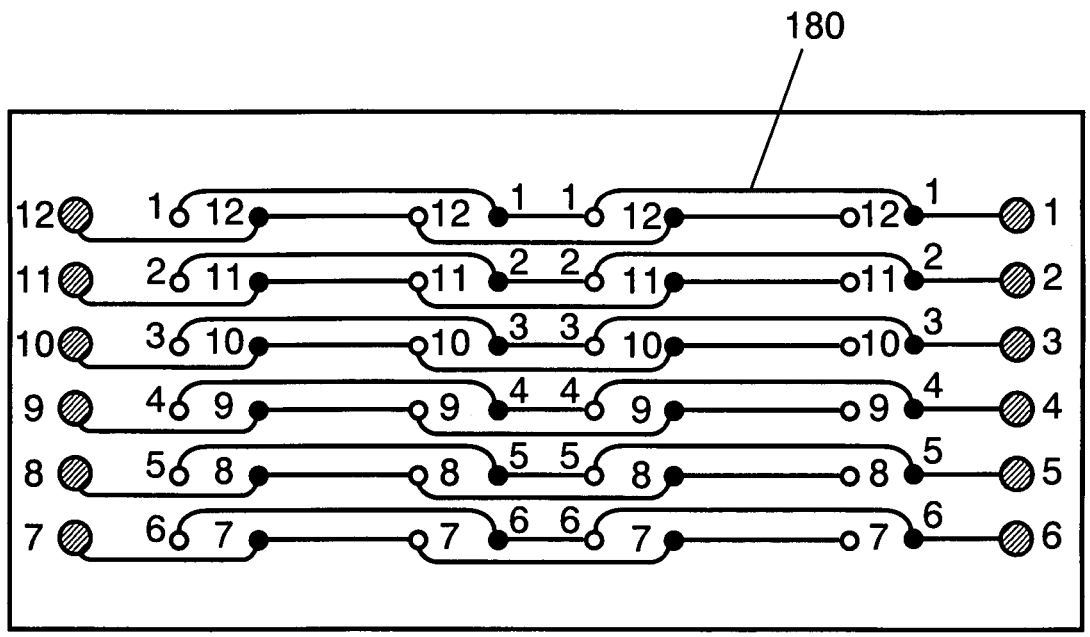
FIG. 11A is a schematic diagram illustrating a second wiring pattern formed on the substrate module according to the third embodiment of the present invention.
Figure 11B:
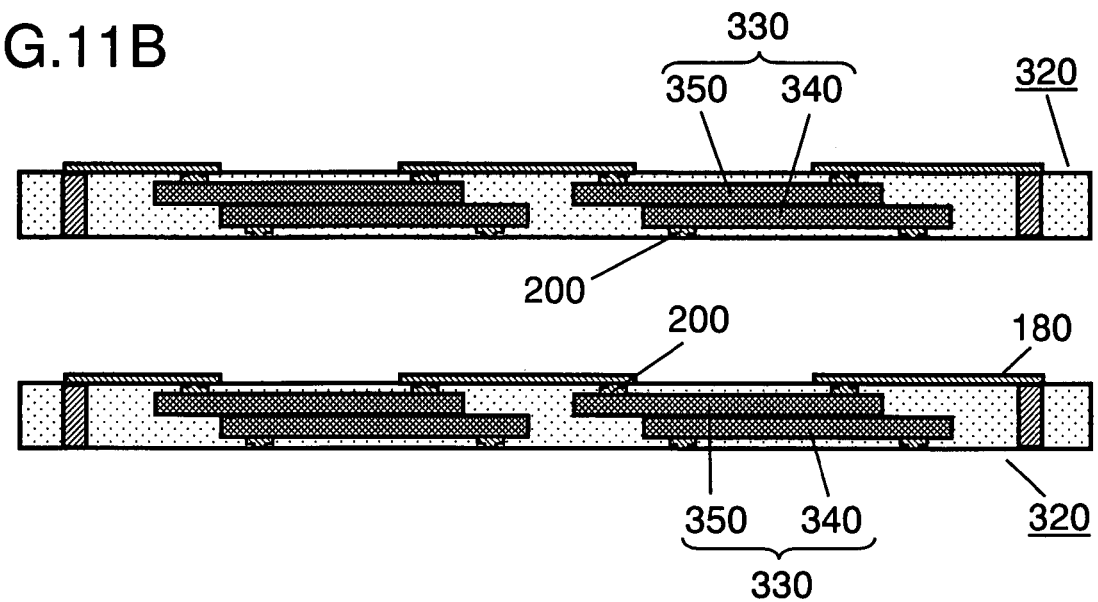
FIG. 11B is a sectional view illustrating the correspondence between the second wiring pattern in FIG. 11A and the electrode terminals of a joint electronic component.

FIGS. 11A and 11B illustrate an example of second wiring pattern 180 connecting to electrode terminal 200 of joint electronic components 330 facing each other between substrate modules 320.

FIG. 11A is a schematic diagram illustrating second wiring pattern 180 formed on substrate module 320 arranged at the lower side in FIG. 11B. The black circles in the figure show the arrangement of electrode terminals 200 of electronic components 340 in substrate module 320 arranged at the upper side in FIG. 11B, and the numbers indicate the arrangement sequence of electrode terminals 200. In the same way, the white circles in the figure show the arrangement of electrode terminals 200 of electronic component 350 in substrate module 320 arranged at the lower side in FIG. 11B, and the numbers indicate the arrangement sequence of electrode terminals 200.

Then, second wiring pattern 180 shown in FIG. 11A causes joint electronic components 330 facing each other between stacked substrate modules 320 to be connected to each other at electrode terminals 200 with the same number.

That is to say, as shown in FIG. 11B, if electronic component 340, 350, being displaced from each other, are bonded together on the surfaces without electrode terminals 200 arranged thereon, electrode terminals 200 at the same position can be connected together, even if the arrangement sequences of electrode terminals 200 are different. Consequently, as long as wiring pattern 180 is formed on one of stacked substrate modules 320, electrode terminals 200 at the same position can be connected together.

This makeup dispenses with second resin sheet 280 of electronic circuit device 100 according to the second embodiment, thus enabling substrate module 320 to be further slimmed down, as well as increasing the packaging density of electronic components and the like in a limited packaging space.

Hereinafter, a description is made for a method for manufacturing substrate module unit 310 according to the third embodiment of the present invention, referring to FIG. 12 and FIGS. 13A through 13D.

Figure 12:
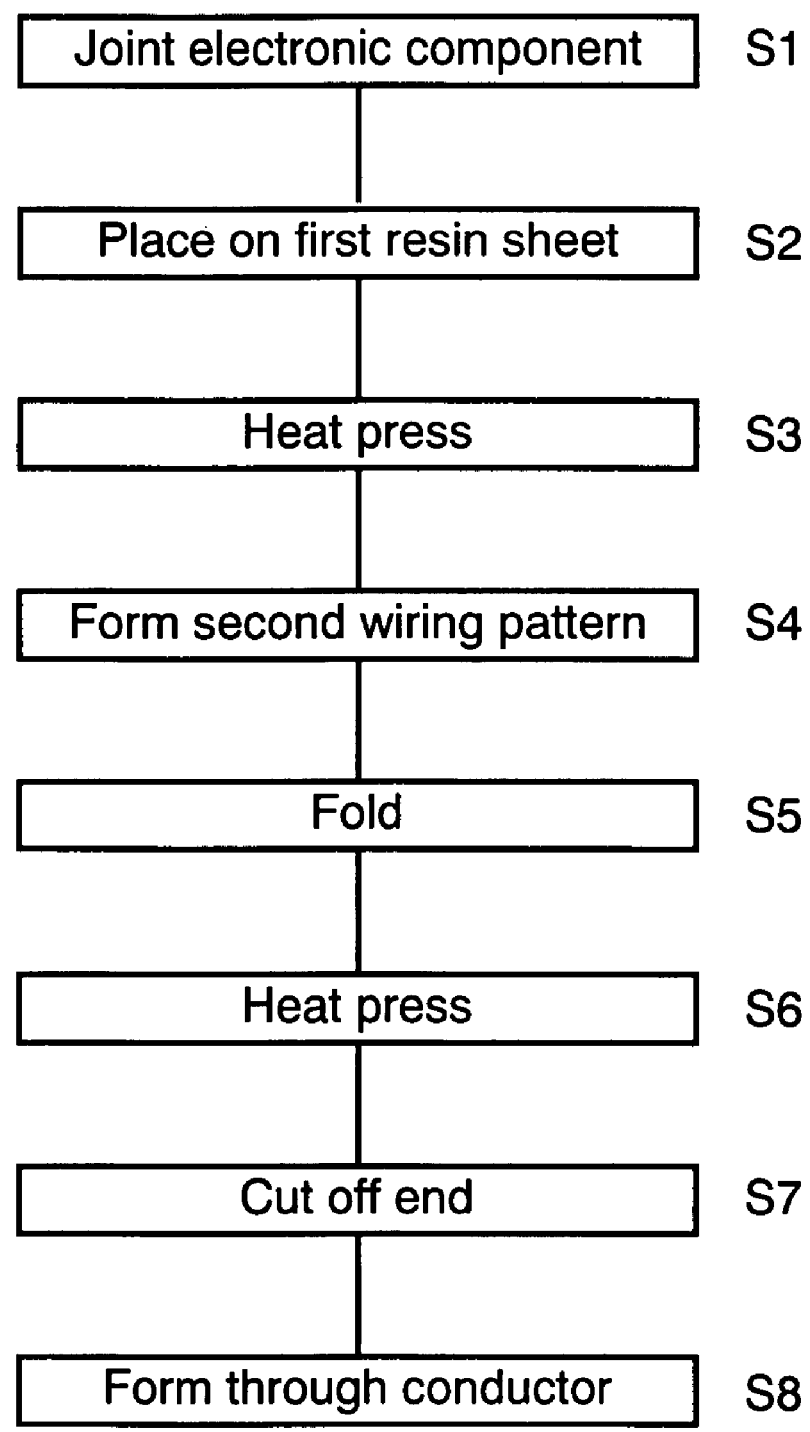
FIG. 12 is a flowchart illustrating a method for manufacturing the substrate module unit according to the third embodiment of the present invention.

FIG. 12 is a flowchart illustrating a method for manufacturing substrate module unit 310 according to the third embodiment of the present invention. FIGS. 13A through 13D are sectional views of the substantial parts in major processing steps in FIG. 12.

First, in step S1, the first surfaces of two electronic components 340, 350, being displaced from each other, with electrode terminals 200 formed near two sides facing each other on each second surface are bonded together, with resin adhesive, for example, to produce joint electronic component 330. Assuming the thickness of electronic component 340, 350 is approximately 50 μm, for example, the thickness of joint electronic component 330 is approximately 100 μm.

Next, in step S2, place one or more joint electronic components 330 at a given position on first resin sheet 210 made of thermoplastic resin with a thickness of approximately 125 μm.

Next, in step S3, sandwich them between heat pressing plates, for example, and heat and press them.

This process causes joint electronic component 330 to be embedded into first resin sheet 210 while at least the surface with electrode terminal 200 is exposed. At this moment, the residue of first resin sheet 210 on electrode terminal 200 of joint electronic component 330 may be removed if required by photolithography, laser beam machining, or the like, to cause electrode terminal 200 to be exposed at surface 210A and back surface 210B of first resin sheet 210.

Next, in step S4, connect one electrode terminal 200 of joint electronic component 330 to another on at least one of first resin sheet 210 and back surface 210B of surface 210A. Form second wiring pattern 180 as shown in FIG. 11A by screen printing, photolithography, or the like. Here, second wiring pattern 180 needs to be formed on both sides of any of the substrate modules that are to be the outermost layer of the substrate module unit. However, second wiring pattern 180 could be formed only on the surface opposite to that stacked for the other stacked substrate modules.

Figure 13A:
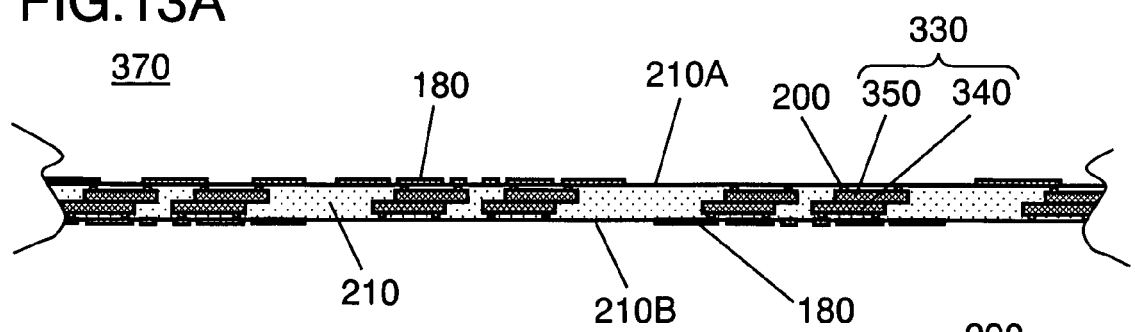
FIG. 13A is a sectional view of the substantial part illustrating the method for manufacturing the substrate module unit according to the third embodiment of the present invention.

Consequently, joint electronic component 330 as shown in FIG. 13A is embedded to complete composite resin sheet 370 including a large number of substrate modules 320 with second wiring patterns 180 formed thereon.

Figure 13B:
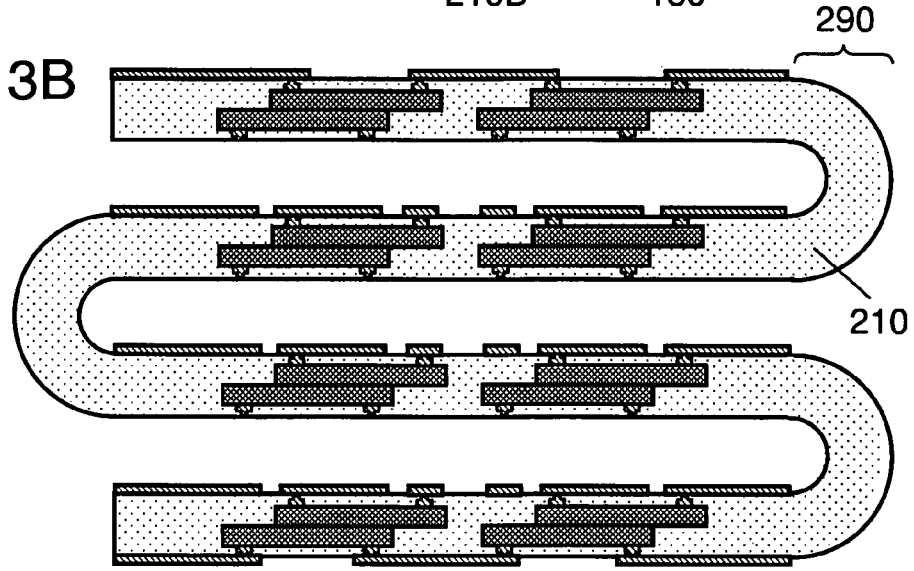
FIG. 13B is a sectional view of the substantial part illustrating the method for manufacturing the substrate module unit according to the third embodiment of the present invention.

Next, in step S5, as shown in FIG. 13B, fold composite resin sheet 370 produced by the above-described method for each substrate module 260 and stack it. Here, FIG. 13B illustrates a state of the layers separated to show the stacked state clearly.

Next, in step S6, sandwich this folded composite resin sheet 370 between heat pressing plates, for example, and then heat and press them to melt first resin sheet 210 of each substrate module 320 to be integrated. If the material of the first resin sheet is polyethylene terephthalate, for example, the welding force is 35 kg/cm2, the heating temperature is 120° C., and the pressing time is 1 minute.

Figure 13C:
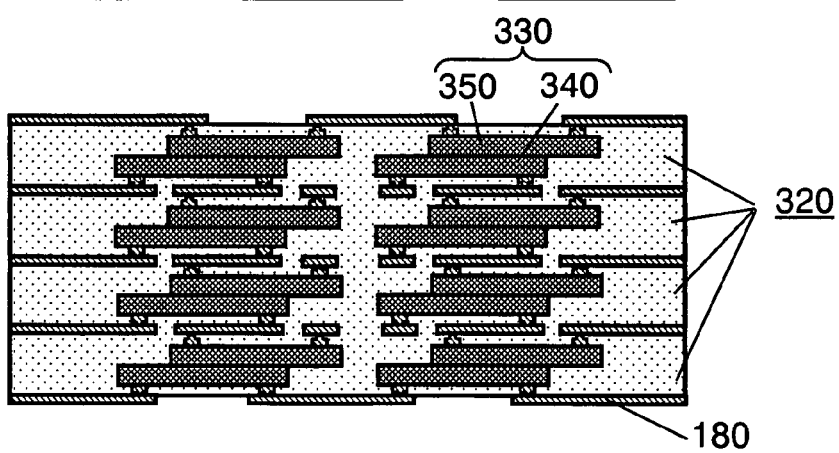
FIG. 13C is a sectional view of the substantial part illustrating the method for manufacturing the substrate module unit according to the third embodiment of the present invention.

Next, in step S7, cut off end 290 of folded composite resin sheet 370 to complete multiple stacked substrate modules 320 as shown in FIG. 13C.

Figure 13D:
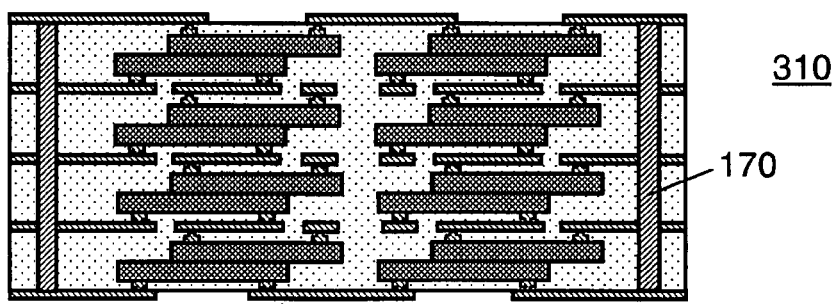
FIG. 13D is a sectional view of the substantial part illustrating the method for manufacturing the substrate module unit according to the third embodiment of the present invention.

Next, in step S8, form a through hole in a region where joint electronic component 330 of integrated substrate module 320 does not exist, and then fill conductive paste or the like into the hole with. When the paste is hardened, substrate module unit 310 having through conductor 170 as shown in FIG. 13D is completed.

Figure 14:
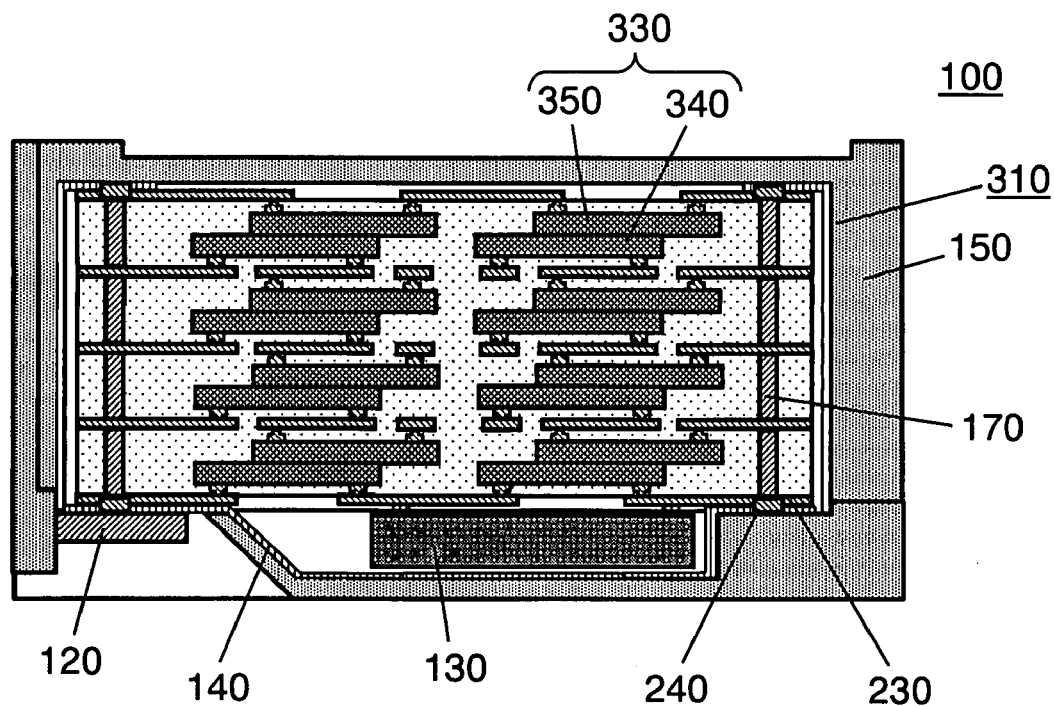
FIG. 14 is a sectional view of another example of the electronic circuit device according to the third embodiment of the present invention.

Hereinafter, a description is made for another example of the electronic circuit device according to the third embodiment of the present invention, using FIG. 14.

Another example of electronic circuit device 100 according to the third embodiment of the present invention loads control circuit 130 on substrate module unit 310.

This makeup, by forming an electrode pad to be connected to control circuit 130 at substrate module unit 310, flat and easy to miniaturize, enables control circuit 130 with the electrode pad with fine-grained pitches to be mounted easily.

Here, in the above-described third embodiment, the description is made for an example where the composite resin sheet is folded to form a substrate module unit. However, the present invention is not limited to this example. For example, the composite resin sheet may be cut off individually for each substrate module, and the fragments are stacked to form a substrate module unit. This method dispenses with a portion to be an end, thus increasing the yield of substrate modules in a composite resin sheet.

Figure 15:
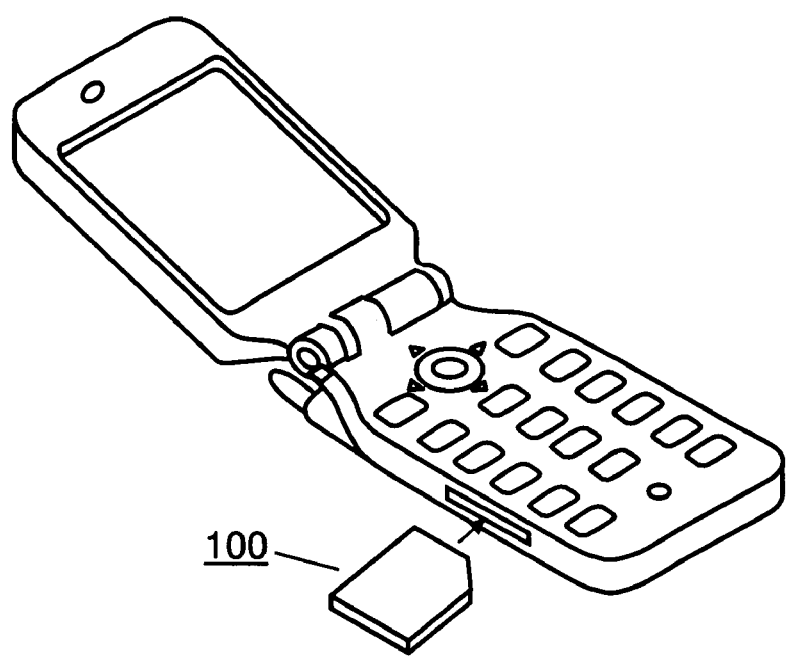
FIG. 15 illustrates an example electronic device using an electronic circuit device.
Figure 16:
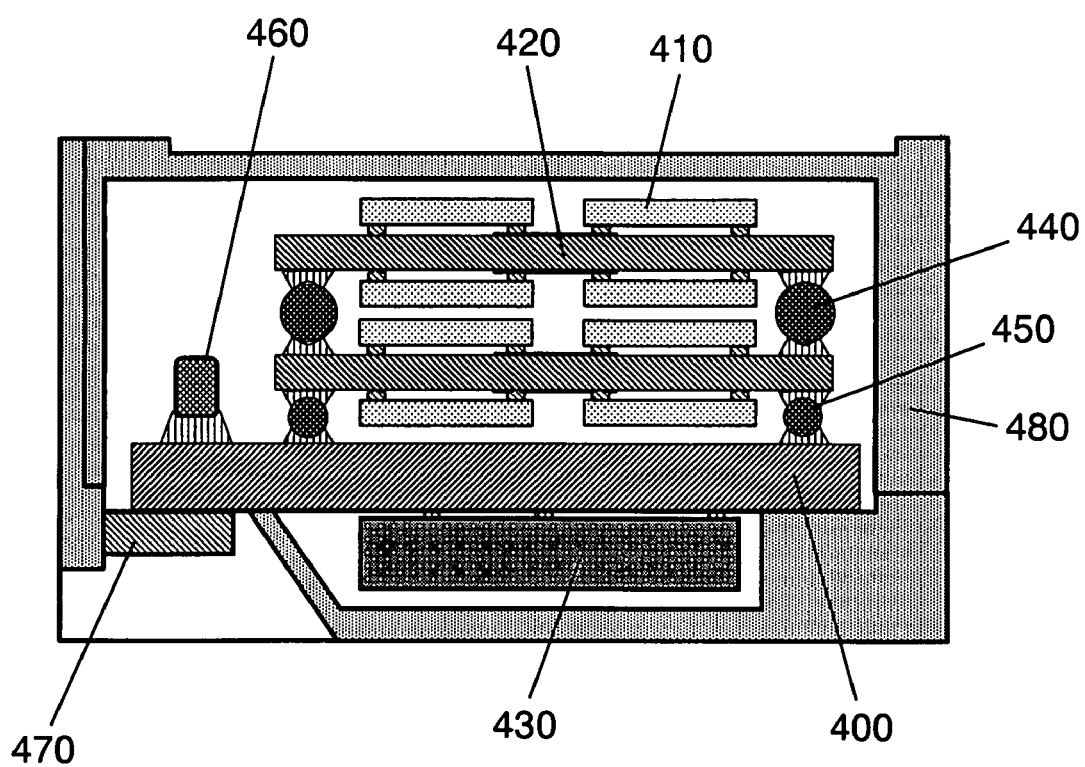
FIG. 16 is a sectional view illustrating the outline structure of a conventional memory card.

By using an electronic circuit device according to each embodiment described above as an IC card or memory card for an electronic device such as a mobile phone shown in FIG. 15 and a personal computer, higher performance and higher functionality of the electronic device are mounted easily.

INDUSTRIAL APPLICABILITY

An electronic circuit device according to the present invention dispenses with a mother substrate and enables stacking while increasing the packaging density of electronic components in a limited packaging space, and thus useful for information storage devices requiring greater storage capacity and higher functionality, and an electronic device loaded with them.

The invention claimed is:

1. An electronic circuit device, comprising:
a control circuit;
a housing having a connecting terminal and a first wiring pattern; and
a substrate module unit formed
by embedding an electronic component into a first resin sheet so as to expose an electrode terminal of the electronic component,
by integrally stacking a plurality of substrate modules having a second wiring pattern connecting to the electrode terminal, on a surface of the first resin sheet through a second resin sheet, and
by connecting the second wiring patterns between the different substrate modules to each other through a through conductor, wherein
the substrate module unit is inserted into the housing, and wherein
the first wiring pattern of the housing is connected to the through conductor.

2. The electronic circuit device of claim 1, wherein the electronic component is a joint electronic component formed by integrally bonding first surfaces of two electronic components with electrode terminals formed on second surfaces of the electronic components.

3. The electronic circuit device of claim 1, wherein the control circuit is connected to the first wiring pattern of the housing.

4. The electronic circuit device of claim 1, wherein the control circuit is loaded on the substrate module unit.

5. The electronic circuit device of claim 1, wherein the electronic component is made of a semiconductor memory, and wherein the control circuit is made of a semiconductor element controlling the semiconductor memory.

6. An electronic device using the electronic circuit device of claim 5.

7. An electronic circuit device, comprising:
a control circuit;
a housing having a connecting terminal and a first wiring pattern; and
a substrate module unit formed
by embedding a joint electronic component formed by bonding first surfaces of two electronic components with electrode terminals formed near two sides facing each other on second surfaces of the electronic components, with positions of the electrode terminals displaced from each other, into a first resin sheet so as to expose surfaces of the electrode terminals, and
by integrally stacking a plurality of substrate modules having a second wiring pattern connecting to the electrode terminal, on a surface of the first resin sheet, and
by connecting the second wiring patterns between the different substrate modules to each other through a through conductor, wherein
the substrate module unit is inserted into the housing, and wherein
the first wiring pattern of the housing is connected to the through conductor.

8. The electronic circuit device of claim 7, wherein the control circuit is connected to the first wiring pattern of the housing.

9. The electronic circuit device of claim 7, wherein the control circuit is loaded on the substrate module unit.

10. The electronic circuit device of claim 7, wherein the electronic component is made of a semiconductor memory, and wherein the control circuit is made of a semiconductor element controlling the semiconductor memory.

11. A method for manufacturing an electronic circuit device comprising:
forming a connecting terminal, a control circuit, and a first wiring pattern, in a housing;
forming a substrate module unit by integrally stacking a plurality of substrate modules having an electronic component with an electrode terminal formed on a first surface thereof, a first resin sheet with the electronic component embedded thereinto so as to expose a surface of the electrode terminal, a second wiring pattern connecting to the electrode terminal exposed at a surface of the first resin sheet, and a through conductor connecting the second wiring patterns, through a second resin sheet, wherein the substrate module unit is connected with the through conductor; and connecting the through conductor of the substrate module unit to the first wiring pattern of the housing.

12. The method for manufacturing the electronic circuit device of claim 11, wherein the electronic component is a joint electronic component formed by integrally bonding together first surfaces of the electronic components, with two electronic components with electrode terminals formed on second surfaces thereof as a pair.

13. The method for manufacturing an electronic circuit device of claim 12, wherein the forming a substrate module unit integrally forms a substrate module unit by folding a composite resin sheet formed continuously with a plurality of substrate modules having the first resin sheet with the joint electronic component embedded thereinto, the second wiring pattern connecting to the electrode terminal exposed at a surface of the first resin sheet, the second resin sheet covering the second wiring pattern, and the through conductor that connects to the second wiring pattern and that is exposed at a surface of the second resin sheet, for each substrate module, so that the joint electronic components face each other.

14. The method for manufacturing an electronic circuit device of claim 12, wherein the joint electronic component is made of a semiconductor memory; and wherein surfaces opposite to those with electrode terminals formed thereon, of two pieces of wafers are mutually faced, the semiconductor memories on the wafers are aligned, bonded together, and then cut off collectively.

15. A method for manufacturing an electronic circuit device comprising:

forming a connecting terminal, a control circuit, and a first wiring pattern, in a housing;

forming a substrate module unit by integrally stacking a plurality of substrate modules having a joint electronic component formed by integrally bonding first surfaces of two electronic components with electrode terminals formed near two sides facing each other on second surfaces of the electronic components, with positions of the electrode terminals displaced from each other, a first resin sheet with the joint electronic component embedded thereinto so as to expose the electrode terminals, and a second wiring pattern connecting to the electrode terminal exposed at a surface of the first resin sheet, wherein the second wiring patterns between the different substrate modules are connected through a through conductor; and connecting the through conductor of the substrate module unit to the first wiring pattern of the housing.

16. The method for manufacturing an electronic circuit device of claim 15, wherein the forming a substrate module unit integrally forms a substrate module unit by folding a composite resin sheet formed continuously with a plurality of substrate modules having the first resin sheet with the joint electronic component embedded thereinto, the second wiring pattern connecting to the electrode terminal exposed at a surface of the first resin sheet, and the through conductor that connects to the second wiring pattern and that is exposed at a surface of the first resin sheet, for each substrate module, so that the joint electronic components face each other.

* * * * *